(12) United States Patent
Subramanian et al.

(10) Patent No.: US 6,365,281 B1
(45) Date of Patent: Apr. 2, 2002

(54) THERMAL BARRIER COATINGS FOR TURBINE COMPONENTS

(75) Inventors: Ramesh Subramanian, Oviedo; Stephen M. Sabol, Orlando; John G. Goedjen, Oviedo, all of FL (US); Kelly M. Sloan, Bethesda, MD (US); Steven J. Vance, Orlando, FL (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 0 days.

(21) Appl. No.: 09/405,498

(22) Filed: Sep. 24, 1999

(51) Int. Cl.⁷ .................................................. B32B 15/04
(52) U.S. Cl. ........................ 428/472; 428/469; 428/632; 428/633; 416/241 B
(58) Field of Search ................................ 428/469, 472, 428/632, 633; 416/241 B

(56) References Cited

U.S. PATENT DOCUMENTS

| | | |
|---|---|---|
| 4,321,311 A | 3/1982 | Strangman |
| 4,916,022 A | 4/1990 | Solfest et al. |
| 5,180,285 A | 1/1993 | Lau |
| 5,238,752 A | 8/1993 | Duderstadt et al. |
| 5,562,998 A | 10/1996 | Strangman |
| 5,630,314 A | 5/1997 | Kojima et al. |
| 5,683,825 A | 11/1997 | Bruce et al. |
| 5,687,679 A | 11/1997 | Mullin et al. |
| 5,716,720 A | 2/1998 | Murphy |
| 5,783,315 A | 7/1998 | Schaeffer et al. |
| 5,902,276 A * | 5/1999 | Waku et al. ................. 501/127 |
| 6,015,630 A * | 1/2000 | Padture et al. .............. 428/632 |
| 6,106,959 A * | 8/2000 | Vance et al. ................. 428/623 |

OTHER PUBLICATIONS

Padture & Klemens, Low Thermal Conductivity in Garnets, *Journal of the American Ceramic Society*, Apr. 1997, pp. 1018–1020, vol. 80(4), American Ceramic Society, Westerville, Oh.

* cited by examiner

*Primary Examiner*—Deborah Jones
*Assistant Examiner*—Jennifer McNeil

(57) ABSTRACT

A turbine component, such as a turbine blade having a metal substrate (22) is coated with a metal MCrAlY alloy layer (24) and then a thermal barrier layer (20) selected from $LaAlO_3$, $NdAlO_3$, $La_2Hf_2O_7$, $Dy_3Al_5O_{12}$, $HO_3Al_3O_{12}$, $ErAlO_3$, $GdAlO_3$, $Yb_2Ti_2O_7$, $LaYbO_3$, $Gd_2Hf_2O_7$ or $Y_3Al_5O_{12}$.

9 Claims, 1 Drawing Sheet

THERMAL BARRIER COATINGS FOR TURBINE COMPONENTS

GOVERNMENT CONTRACT

The Government of the United States of America has rights in this invention pursuant to Contract DE-AC05-950R22242, awarded by the United States Department of Energy.

BACKGROUND OF THE INVENTION

1. Field of the Invention

The invention relates generally to the field of thermal barrier coatings, and more particularly, to new thermal barrier coating compositions to extend the operating temperature capabilities for the components in a combustion turbine engine.

2. Background Information

The demand for continued improvement in the efficiency of combustion turbine and combined cycle power plants has driven the designers of these systems to specify increasingly higher firing temperatures in the combustion portions of these systems. Although nickel and cobalt based "superalloy" materials are now used for components in the hot gas flow path, such as combustor transition pieces and turbine rotating and stationary blades, even these superalloy materials are not capable of surviving long term operation at temperatures sometimes exceeding 1,200° C.

Examples of cobalt or nickel based superalloys are, for example, Cr.Al.Co.Ta.Mo.W, which has been used for making SC turbine blades and vanes for gas turbines, as taught, for example, in U.S. Pat. No. 5,716,720 (Murphy).

These turbine components are generally protected by a basecoat of MCrAlY, where M is selected from the group of Fe, Co, Ni, and their mixtures, as taught, for example, by U.S. Pat. Nos. 4,916,022; 5,238,752; 5,562,998; and 5,683,825 (Solfest et al.; Duderstadt et al.; Strangman; and Bruce et al., respectively). These basecoats are usually covered by an aluminum oxide layer and a final thermal barrier coating. The standard thermal barrier coating ("TBC") is made from yttria-stabilized zirconia, ceria-stabilized zirconia, scandia-stabilized zirconia or non-stabilized zirconia, as taught, for example, by the Bruce et al. patent U.S. Pat. No. 5,683,825.

Much of the development in this field of technology has been driven by the aircraft engine industry, where turbine engines are required to operate at high temperatures, and are also subjected to frequent temperature transients as the power level of the engine is varied. A combustion turbine engine installed in a land-based power generating plant is also subjected to high operating temperatures and temperature transients, but it may also be required to operate at full power and at its highest temperatures for very long periods of time, such as for days or even weeks at a time. Prior art insulating systems are susceptible to degradation under such conditions at the elevated temperatures demanded in the most modern combustion turbine systems.

One high temperature coating used to protect jet engine and gas turbine components is Cr.Al.Ti, overlayed with a stabilized zirconia ceramic, as taught in U.S. Pat. No. 5,783,315 (Schaeffer et al.). Many of the ceramic thermal barrier layers are deposited as a columnar structure in the direction of the thickness, as taught in U.S. Pat. No. 4,321,311 (Strangman). This structure can be formed by electron beam physical vapor deposition ("EBPVD") as in Bruce et al. U.S. Pat. No. 5,683,825, or a combination of electron beam deposition and ion beam irradiation, or the like, such as the $ZrO_2$ thermal barrier layer taught in U.S. Pat. No. 5,630,314 (Kojima et al.). Laminates of as many as 20 alternative layers of alumina and yttria stabilized zirconia have also been used as thermal barriers to improve resistance to heat flow for superalloys used in air cooled gas turbines, as taught in U.S. Pat. No. 5,687,679 (Mullin et al.).

Other barrier coating materials include $MgTiO_3$ and $Mg_2TiO_4$, as taught in U.S. Pat. No. 5,180,285 (Lau). Padture et al., in *J. Am. Ceram. Soc.* 80[4]1018–20 (1997) have suggested $Y_3Al_xFe_{5-x}O_{12}$, and $Y_3Al_5O_{12}$ (YAG), as well as possibly $Y_3Al_5O_{12}$, where Gd, Er or La can substitute for some of the Y sites, as possible thermal barrier coatings.

While zirconia based ceramics provide excellent thermal barrier coatings for a variety of substrates such as turbine blades, more sophisticated coatings are needed to extend the operating temperature capabilities of combustion turbine engines beyond the current state of the art. Recent increases in rotor inlet temperatures are backing up against inherent limitations in the temperature at which yttria stabilized zirconia may be used. Long term exposure of yttria stabilized zirconia above approximately 1200° C. can lead to phase destabilization, sintering of the coating, loss of coating compliance and ultimately, possible premature thermal barrier coating failure. Further advances in gas turbine operating temperatures therefore require a ceramic thermal barrier coating capable of surface temperatures in excess of 1000° C.

SUMMARY OF THE INVENTION

Therefore, it is a main object of this invention to provide improved thermal barrier coating layers for use on underlayers, such as alumina and MCrAlY, protecting turbine components, such as superalloy turbine blade assemblies that can operate over 1000° C. for extended periods of time with reduced component degradation.

These and other objects of the invention are accomplished by providing a turbine component containing at least one layer of a thermal barrier coating selected from the group consisting of $LaAlO_3$, $NdAlO_3$, $La_2Hf_2O_7$, $Dy_3Al_5O_{12}$, $Ho_3Al_5O_{12}$, $ErAlO_3$, $GdAlO_3$, $Yb_2Ti_2O_7$, $LaYbO_3$, $Gd_2Hf_2O_7$, and $Y_3Al_5O_{12}$. Usually, the thermal barrier coating will be deposited upon an MCrAlY type alloy layer covering an alloy turbine substrate; where M ("metal") is selected from the group consisting of Fe, Co, Ni and mixtures thereof. The MCrAlY layer may have an aluminum oxide layer, resulting from oxidation during the deposition coating process or during service. The turbine component can be a turbine blade, a turbine vane, a transition piece, a combustor, and ring segments, or the like, of a high temperature gas turbine, where the thermal barrier coating helps protect the component from impact and erosion by particulates, and from a hostile thermal environment. These coatings can extend the operating temperature capabilities of combustion turbine engines beyond the current state of the art zirconia coatings.

BRIEF DESCRIPTION OF THE DRAWINGS

The above and other advantages of this invention will be more apparent from the following description in view of the drawings where.

DETAILED DESCRIPTION OF THE PREFERRED EMBODIMENTS

Figure 1:
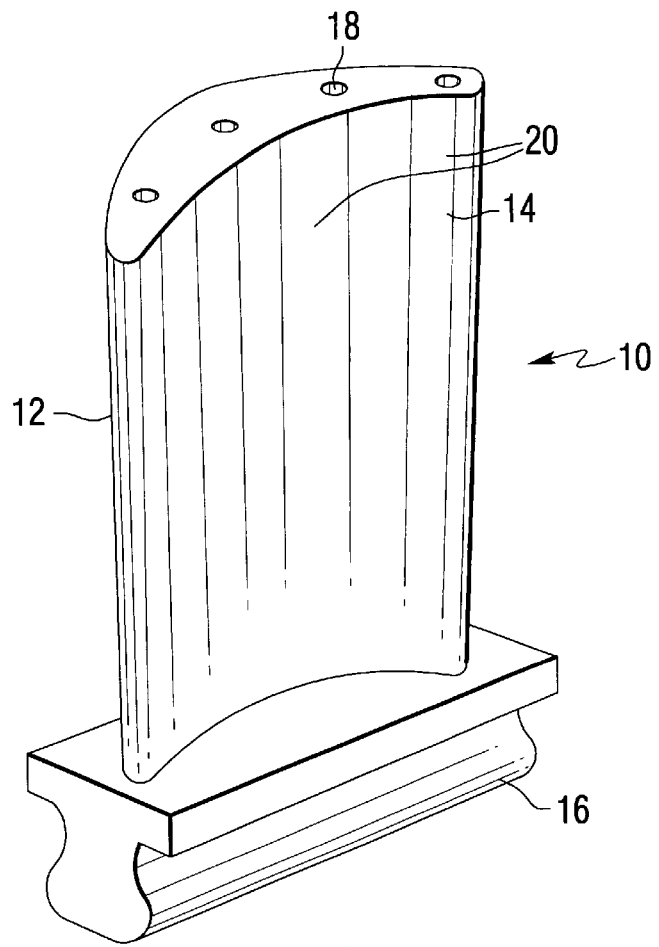
FIG. 1 is a perspective view of a turbine blade having a thermal barrier coating thereon.

Referring now to FIG. 1, one component of a turbine is shown. Turbine blade 10 has a leading edge 12 and an airfoil section 14 against which hot combustion gases are directed during operation of the turbine and which is subject to severe thermal stresses, oxidation and corrosion. The root end 16 of the blade anchors the blade. Cooling passages 18 may be present through the blade to allow cooling air to transfer heat from the blade. The blade itself can be made from a high temperature resistant nickel or cobalt based superalloy, such as a combination of Ni.Cr.Al.Co.Ta.Mo.W, or more specifically a composition of, by weight, 10% Co, 8.4% Cr, 0.65% Mo, 10% W, 3.3% Ta, 1.05% Ti, 5.5% Al, and 1.4% Hf, with minor amounts of Zr, C, and B in a Ni matrix (commercially known as "MAR-M247 alloy").

The thermal barrier coating ("TBC") 20 would cover the body of the turbine blade. Use of the coating on the turbine blade of FIG. 1 is only illustrative. The coating can be used on other components of turbines used with generators, such as, turbine vanes, transition pieces, combustors, ring segments, or the like, or upon any substrate made of, for example, metal or ceramic, where thermal protection is required.

Figure 2:
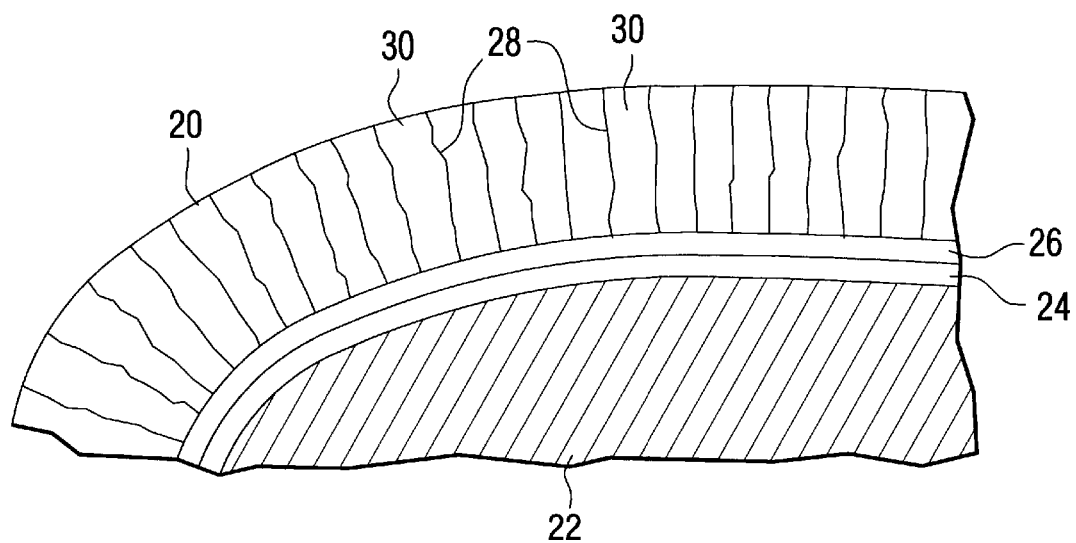
FIG. 2, which best shows the invention, is a fragmented sectional view through a turbine component, such as the turbine blade of FIG. 1.

As an example, FIG. 2 shows one configuration for possible thermal layering protection of a turbine component substrate 22, such as the superalloy core of a turbine blade. A metallic bond layer 24 of a MCrAlY type alloy can be used as a first layer on the substrate, where M ("metal") in the alloy is selected from the group of Ni, Co, Fe and their mixtures, and Y can include yttrium Y, as well as La and Hf. This layer can be applied by sputtering, electron beam vapor deposition or low pressure plasma spraying, to provide a dense, relatively uniform layer about 0.002 cm to 0.0245 cm (0.001 inch to 0.01 inch) thick. This layer can subsequently be polished to provide a smooth finish. One purpose of this layer is to allow an oxide scale 26, predominately alumina to form, in order to further protect the substrate 22 from oxidative attack. The scale layer 26 also provides a good bonding surface for the exterior, top coat, ceramic TBC 20 which is shown in FIG. 2 in a type of strain tolerant columnar structure deposited by electron beam physical vapor deposition ("EBPVD"), with the columns oriented substantially perpendicular to the surface of the substrate. Such a columnar structure may also have implanted deposits of another material between discreet parts or microcracks 28 between columns 30 of the columnar structure. Such deposits help in inhibiting sintering and erosion, and the like.

Various combinations of underlayers 24 and 26 can be used within the scope of this invention and in some instances, the thermal barrier coatings of this invention can be directly deposited on the substrate 22. The ceramic thermal barrier can be applied by any method providing good adherence in a thickness effective to provide the required thermal protection for the substrate 22, usually in the order of about 50 micrometers to about 500 micrometers. The ceramic thermal barrier can be applied by EBPVD, a plasma spray process, a sol-gel process, chemical vapor deposition, or the like, and combinations thereof to give a variety of coating-microstructures. The EBPVD plasma spray, sol-gel techniques and chemical vapor deposition are all well known in the art. The plasma spray process would not provide the columnar structure shown but would provide an interconnected network of microcracks performing essentially the same function. While, in FIG. 2, the ceramic thermal barrier 20 is shown having a columnar structure, such is not a requirement, and a dense or continuous coating can also be used.

The improved thermal barrier coatings 20 of this invention are selected from the group consisting of $LaAlO_3$, $NdAlO_3$, $La_2Hf_2O_7$, $Dy_3Al_5O_{12}$, $Ho_3Al_5O_{12}$, $ErAlO_3$, $GdAlO_3$, $Yb_2Ti_2O_7$, $LaYbO_3$, $Gd_2Hf_2O_7$ and $Y_3Al_5O_{12}$. While these materials are listed together, many of their chemical characteristics and mechanical characteristics are substantially different, and applicants herein do not suggest or imply that any one of the group is the equivalent of any other.

These compounds have excellent phase stability at temperatures as high as 1400° C. (2552° F.) and are not subject to substantial sintering. These compounds also have increased microstructural stability and a high melting temperature so they are resistant to sintering with long term exposure. As such, they will retain the compliance offered by the microstructure (microcracks or columnar structure) preventing premature failure at increased temperature. In addition, the above compounds have favorable thermal conductivity and expansion properties, making them successful as thermal barrier coatings. These coatings decrease hot gas path cooling air requirements in modern gas turbine engines and subsequently increase engine thermal efficiency. These ceramics may be deposited over a metallic bond coat, diffusion coating, or even directly onto the substrate. These ceramics may be applied by electron beam physical vapor deposition ("EBPVD") plasma spraying, or the like processes.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalent thereof.

What is claimed is:

1. A turbine component containing at least one layer of a thermal barrier coating selected from the group consisting of $LaAlO_3$, $NdAlO_3$, $La_2Hf_2O_7$, $ErAlO_3$, $GdAlO_3$, $Yb_2Ti_2O_7$, $LaYbO_3$, and $Gd_2Hf_2O_7$, where the thermal barrier coating is disposed upon a MCrAlY type alloy layer covering a metal alloy turbine substrate, where M is selected from the group consisting of Fe, Co, Ni and mixtures thereof, and where the MCrAlY layer has an alumina layer resulting from oxidation during service or during the coating process.

2. The turbine component of claim 1, where the thermal barrier coating is $LaAlO_3$.

3. The turbine component of claim 1, where the thermal barrier coating is $ErAlO_3$.

4. The turbine component of claim 1, where the thermal barrier coating is $Yb_2Ti_2O_7$.

5. The turbine component of claim 1, where the thermal barrier coating is $LaYbO_3$.

6. The turbine component of claim 1, where the thermal barrier coating is $Gd_2Hf_2O_7$.

7. The turbine component of claim 1, where the thermal barrier coating has a thickness of from about 50 micrometers to about 500 micrometers.

8. The turbine component of claim 1, where the component is a turbine blade, vane, transition piece, combustor, or ring segment.

9. The turbine component of claim 1, operating in an environment of over 1000° C.

* * * * *